United States Patent
Sliech et al.

(10) Patent No.: US 9,538,692 B2
(45) Date of Patent: Jan. 3, 2017

(54) INTEGRATED HEAT EXCHANGER AND POWER DELIVERY SYSTEM FOR HIGH POWERED ELECTRONIC MODULES

(71) Applicant: BAE Systems Information and Electronic Systems Integration Inc., Nashua, NH (US)

(72) Inventors: Kevin W. Sliech, Nashua, NH (US); Stephen A. Hedges, Nashua, NH (US); Jared P. Majcher, Manchester, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 34 days.

(21) Appl. No.: 14/429,099

(22) PCT Filed: Jul. 9, 2014

(86) PCT No.: PCT/US2014/045838
§ 371 (c)(1),
(2) Date: Mar. 18, 2015

(87) PCT Pub. No.: WO2015/009491
PCT Pub. Date: Jan. 22, 2015

(65) Prior Publication Data
US 2015/0222099 A1 Aug. 6, 2015

Related U.S. Application Data

(60) Provisional application No. 61/847,677, filed on Jul. 18, 2013.

(51) Int. Cl.
*H02B 1/56* (2006.01)
*H05K 7/20* (2006.01)
(Continued)

(52) U.S. Cl.
CPC ...... *H05K 7/20927* (2013.01); *H01Q 21/0087* (2013.01); *H01R 4/48* (2013.01);
(Continued)

(58) Field of Classification Search
CPC ......... H02B 1/56; H02B 1/20; H01Q 21/0087; H01R 4/28; H01R 12/52; H01L 23/473; H05K 7/209; H05K 7/20218; H05K 7/20254; H05K 7/20927
(Continued)

(56) References Cited

U.S. PATENT DOCUMENTS 5,960,861 A   10/1999   Price et al.
6,005,531 A   12/1999   Cassen et al.
(Continued)

FOREIGN PATENT DOCUMENTS

WO   WO2005119845 A1   12/2005

OTHER PUBLICATIONS

PCT/US14/45838, ISR mailed on Nov. 7, 2014.

*Primary Examiner* — Zachary M Pape
*Assistant Examiner* — Amir Jalali
(74) *Attorney, Agent, or Firm* — Daniel J. Long; Scott J. Asmus

(57) ABSTRACT

An integrated heat exchanger and power delivery system for high powered electronic modules is disclosed. In one embodiment, the system includes a coolant manifold. The system further includes a heat exchanger and power delivery module. The heat exchanger and power delivery module comprises a plurality of heat exchanger and power delivery elements that are coupled to the coolant manifold. The system furthermore includes a high powered electronic module, wherein the high powered module comprises an array of sub-modules. The array of sub-modules is disposed on the plurality of heat exchanger and power delivery
(Continued)

elements. The plurality of heat exchanger and power delivery elements are configured to substantially simultaneously deliver power and extract heat away from the sub-modules.

12 Claims, 4 Drawing Sheets

(51) Int. Cl.
*H01R 4/48* (2006.01)
*H01R 12/52* (2011.01)
*H01Q 21/00* (2006.01)
H02B 1/20 (2006.01)
H01L 23/473 (2006.01)

(52) U.S. Cl.
CPC ............. H01R 12/52 (2013.01); H05K 7/209 (2013.01); *H01L 23/473* (2013.01); *H05K 7/20218* (2013.01)

(58) Field of Classification Search
USPC .......... 361/701–702; 165/80.4–80.5, 104.33; 257/714–715
See application file for complete search history.

(56) References Cited

U.S. PATENT DOCUMENTS

| 6,219,245 | B1* | 4/2001 | Nagashima | H01L 23/473 165/104.33 |
|---|---|---|---|---|
| 6,369,319 | B1* | 4/2002 | Nagashima | B60L 11/00 174/135 |
| 6,819,561 | B2 | 11/2004 | Hartzell et al. | |
| 7,456,789 | B1 | 11/2008 | Mason et al. | |
| 9,345,169 | B1* | 5/2016 | Campbell | H05K 7/20254 |
| 2004/0150554 | A1 | 8/2004 | Stenger et al. | |
| 2008/0150832 | A1 | 6/2008 | Ingram et al. | |
| 2009/0084527 | A1 | 4/2009 | Rummel et al. | |
| 2010/0067193 | A1* | 3/2010 | Arimilli | H05K 7/20809 361/679.47 |
| 2010/0157531 | A1 | 6/2010 | Mason et al. | |
| 2011/0188205 | A1 | 8/2011 | MacManus et al. | |
| 2012/0062866 | A1* | 3/2012 | Binnard | H02K 9/22 355/72 |
| 2012/0145362 | A1* | 6/2012 | Harrington | H01L 23/473 165/109.1 |
| 2014/0198452 | A1* | 7/2014 | Brunschwiler | H05K 13/0023 361/699 |
| 2015/0173251 | A1* | 6/2015 | Campbell | H05K 7/20772 361/699 |
| 2015/0223365 | A1* | 8/2015 | Sliech | H05K 7/20927 361/624 |
| 2016/0143189 | A1* | 5/2016 | Campbell | B29C 70/84 165/185 |
| 2016/0153595 | A1* | 6/2016 | Arvelo | F16L 25/14 285/332 |
| 2016/0165755 | A1* | 6/2016 | Bodenweber | H05K 7/20254 165/80.2 |
| 2016/0183409 | A1* | 6/2016 | Zhou | H05K 7/20281 361/699 |

* cited by examiner

INTEGRATED HEAT EXCHANGER AND POWER DELIVERY SYSTEM FOR HIGH POWERED ELECTRONIC MODULES

CROSS-REFERENCE TO RELATED APPLICATIONS

This Application claims rights under 35 USC §119(e) from U.S. Applications 61/847,677 filed Jul. 18, 2013, the contents of which are incorporated herein by reference.

BACKGROUND OF THE INVENTION

Field of the Invention

The present invention relates to high powered electronic modules and more particularly to cooling and powering of the high powered electronic modules.

Brief Description of Related Art

Typically, heat exchangers do not provide direct current (DC) power to high powered electronic modules. Instead additional large connectors are used to provide the DC power to the high powered electronic modules, such as phased antenna arrays. Generally, electrical connection to other parts or the power electronic system is made by screw contacts, pin contacts (soldered onto a PCB), press-fit contacts pressed into PCB vias, spring contacts that inherently press on contact areas of a PCB or by pure pressure contact where corrosion-proof surface areas are directly pressed together. This may result in sacrificing heat exchange area, which in turn may result in increased thermal impedance and thus further resulting in increased temperature of the high powered electronic modules. Conversely, using smaller connectors may result in decreased thermal impedance, but can result in unwanted voltage drop across pins.

SUMMARY OF THE INVENTION

An integrated heat exchanger and power delivery system for high powered electronic modules is disclosed. According to one aspect of the present subject matter, the system includes a coolant manifold. The system further includes a heat exchanger and power delivery module. The heat exchanger and power delivery module includes a plurality of heat exchanger and power delivery elements that are coupled to the coolant manifold. The system furthermore includes a high powered electronic module, wherein the high powered module comprises an array of sub-modules. The array of sub-modules is disposed on the plurality of heat exchanger and power delivery elements. The plurality of heat exchanger and power delivery elements are configured to substantially simultaneously deliver power and extract heat away from the sub-modules.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

DETAILED DESCRIPTION OF THE INVENTION

The exemplary embodiments described herein in detail for illustrative purposes are subject to many variations in structure and design. The present technique provides an integrated heat exchanger and power delivery system for high powered electronic modules that performs at least two functions, one being delivering DC power to the high powered electronic modules and the other being removing the heat from the high powered electronic modules. This is accomplished by breaking the heat exchanger system into several smaller elements and connecting these elements to either the positive DC supply voltage or the Ground.

The terms "high powered electronic module" and "high powered electronic array" are being used interchangeably throughout the document. Further, the terms "sub-module" and "electronic module" are being used interchangeably throughout the document.

Figure 1:
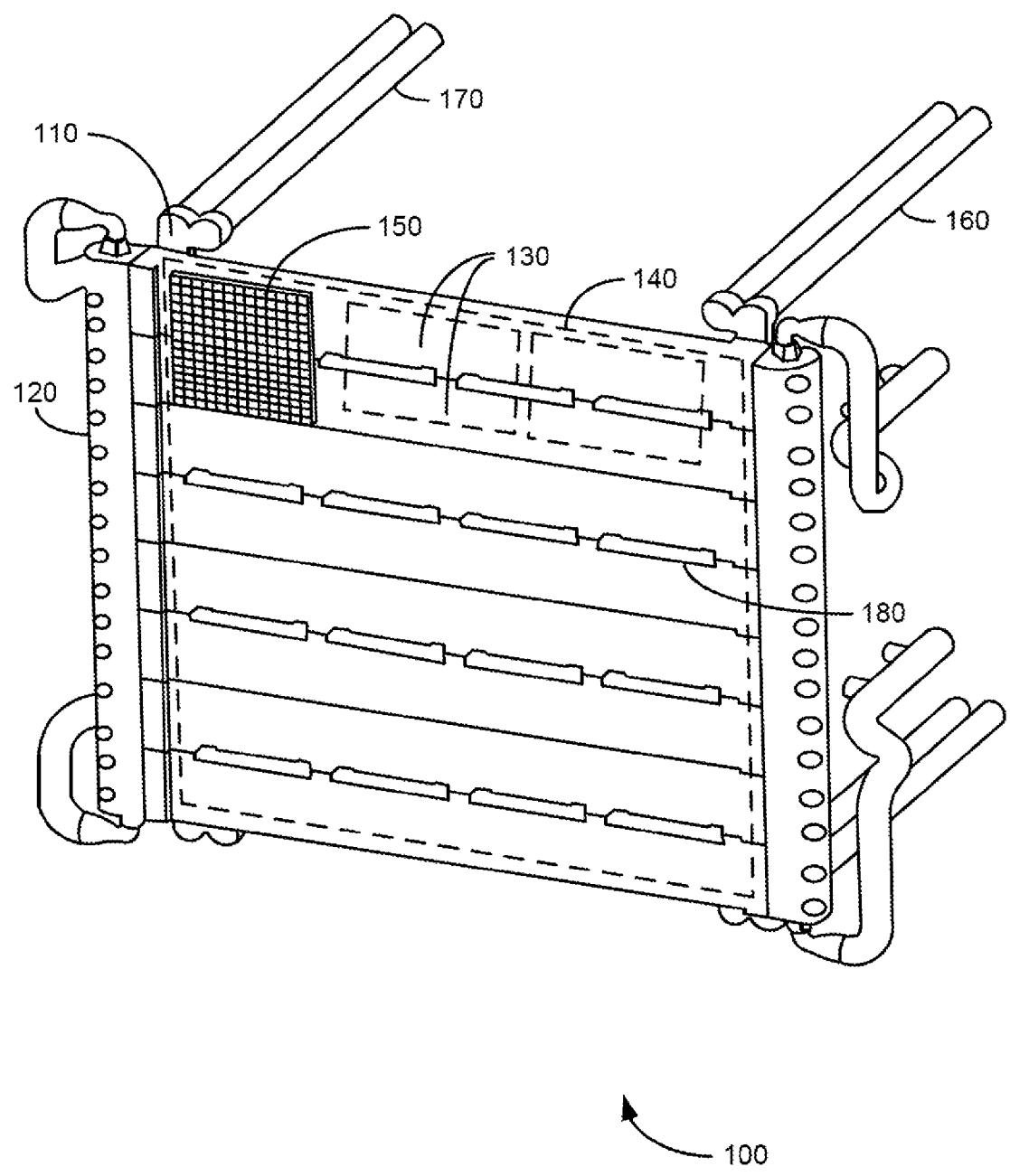
FIG. 1 is a schematic diagram of a front perspective view of an integrated heat exchanger and power delivery system for high powered electronic modules, according to an example embodiment of the present subject matter.

FIG. 1 is a schematic diagram of a front perspective view of an integrated heat exchanger and power delivery system 100 for a high powered electronic module, according to an example embodiment of the present subject matter. As shown in FIG. 1, the integrated heat exchanger and power delivery system 100 includes a coolant manifold 110, a heat exchanger and power delivery module 120, a high powered electronic module 140, an input power cable 160 and an output power cable 170. Further as shown in FIG. 1, the heat exchanger and power delivery module 120 includes a plurality of heat exchanger and power delivery elements 130 that are coupled to the coolant manifold 110. Furthermore as shown in FIG. 1, the high powered electronic module includes an array of sub-modules 150.

In these embodiments, as shown in FIG. 1, the array of sub-modules 150 is disposed across and up and down on the plurality of heat exchanger and power delivery elements 130. Also as shown in FIG. 1, the plurality of heat exchanger and power delivery elements 130 are configured to deliver power and extract heat away from the sub-modules 150. Further in these embodiments, the plurality of heat exchanger and power delivery elements 130 are configured to have needed mass of metal so that they can function as bus bars. Furthermore in these embodiments, the plurality of heat exchanger and power delivery elements 130 can be sealed/configured to power requirements of the high powered electronic module and sub-modules.

As shown in FIGS. 1-4, the plurality of heat exchanger and power delivery elements 130 are configured alternatively to provide positive supply voltage and ground. Further in some embodiments, the plurality of heat exchanger and power delivery elements 130 are configured to carry direct current (DC). In these embodiments, the plurality of heat exchanger and power deliver elements 130 are alternatively connected to DC power and ground.

Figure 2:
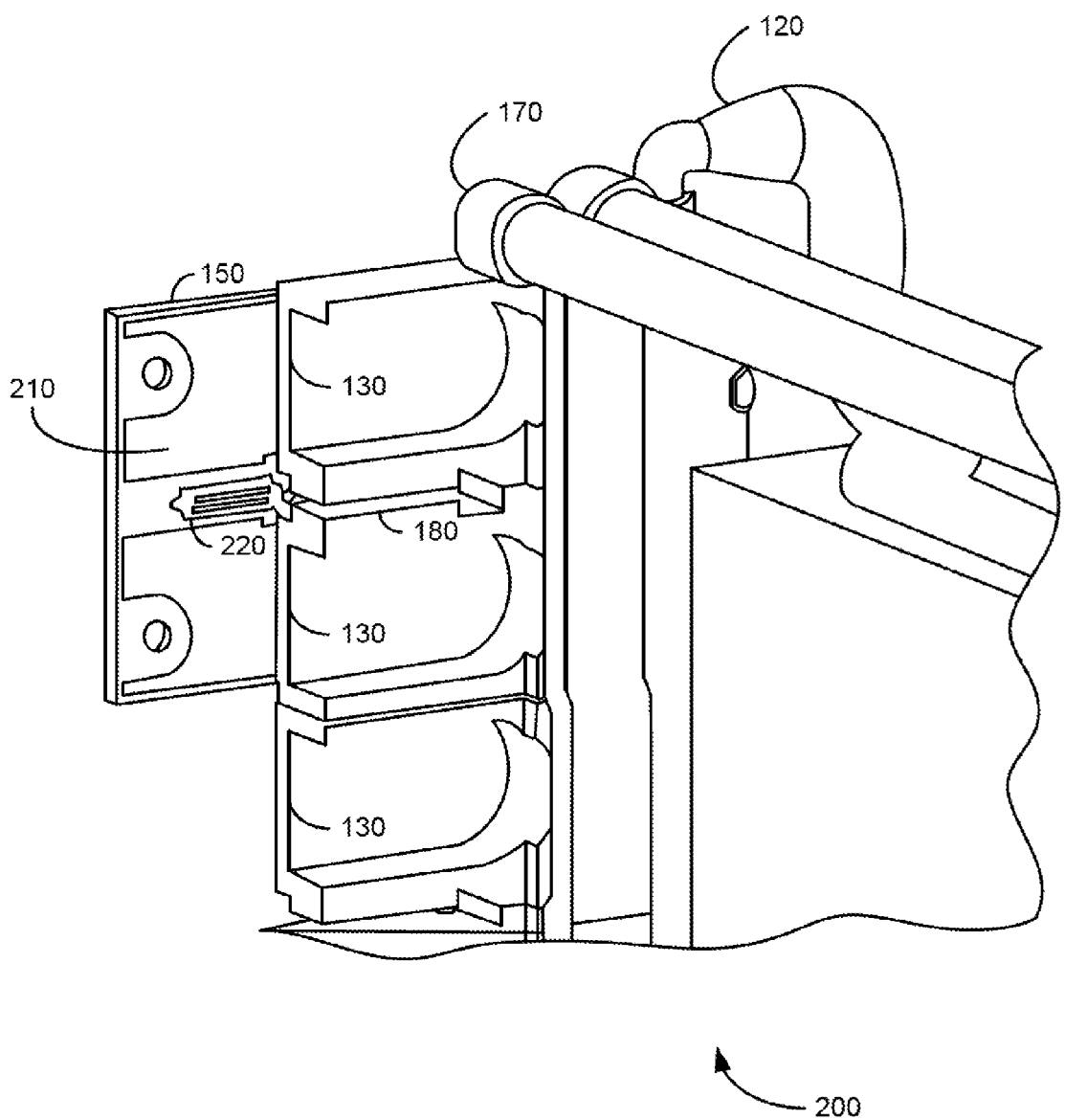
FIG. 2 illustrates location of power pads of electronic modules and how it is in contact with the heat exchanger and power delivery elements, such as those shown in FIG. 1, according to an example embodiment of the present subject matter.
Figure 3:
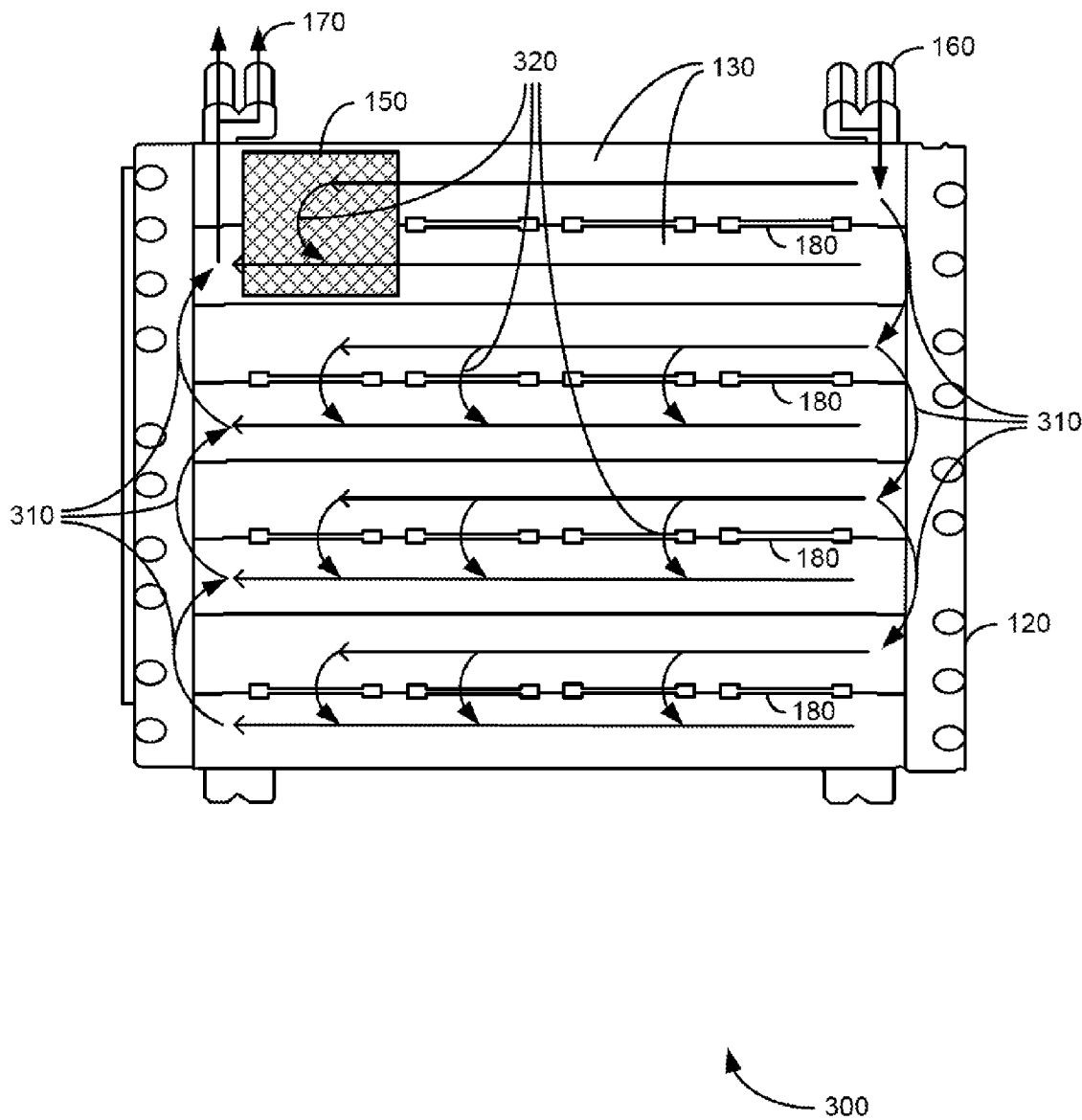
FIG. 3 illustrates power flow pattern between electronic modules and the heat exchanger and power delivery elements, such as those shown in FIG. 1, according to an example embodiment of the present subject matter.
Figure 4:
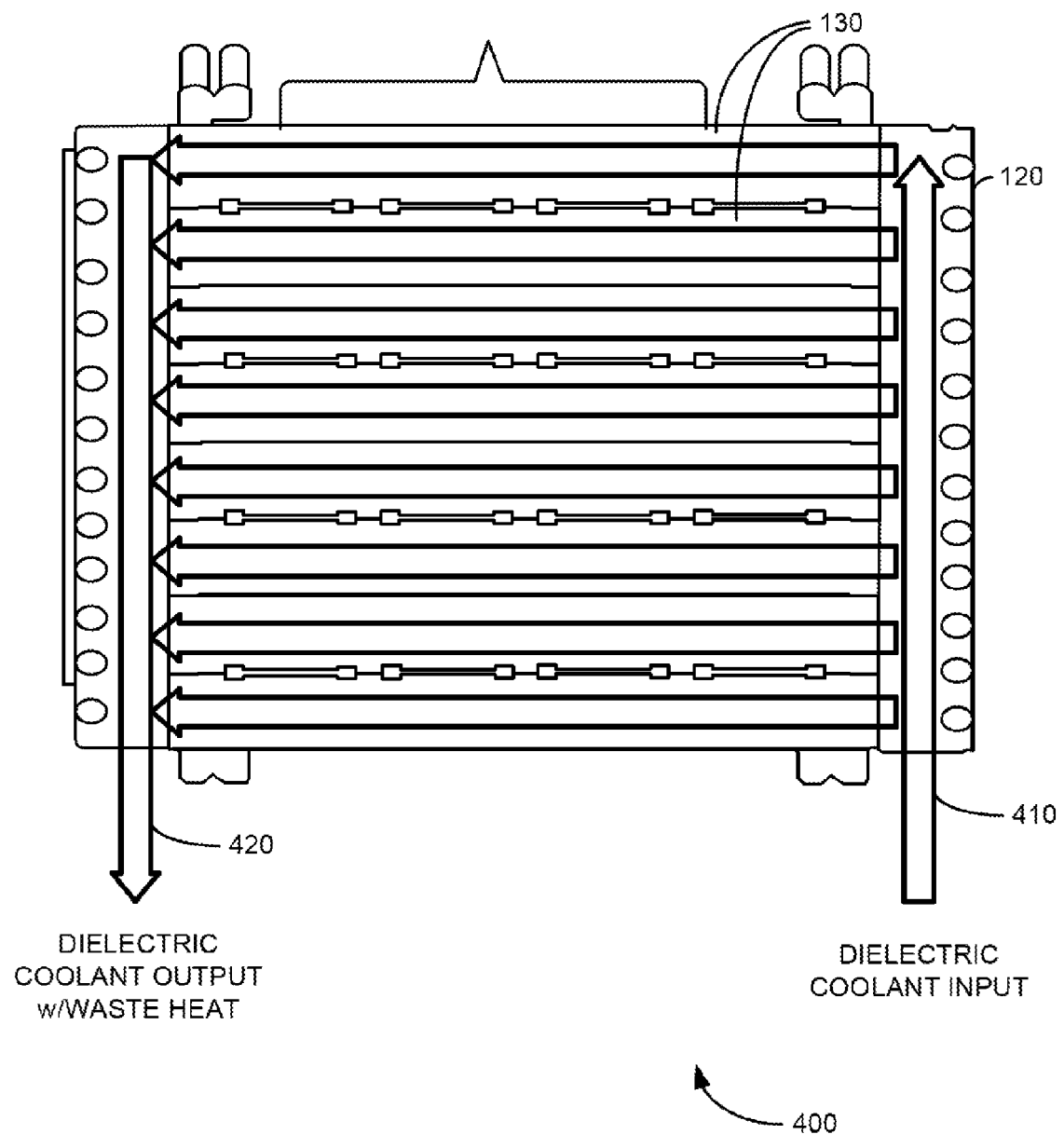
FIG. 4 illustrates dielectric coolant flow path in the heat exchanger and power delivery elements, such as those shown in FIG. 1, according to an example embodiment of the present subject matter.

As shown in FIG. 2, the sub-modules 150 are mounted on the heat exchanger and power delivery elements 130 of the integrated heat exchanger and power delivery system 200, such that the power pads 210 of the sub-modules 150 are electrically and mechanically coupled to the plurality of heat exchanger and power delivery elements 130. Further the sub-modules 150 are mounted to the heat exchanger and power delivery elements 130 via the power pads 210 such that they receive low impedance coupling to the positive supply voltage and ground of the alternatively configured plurality of heat exchanger and power delivery elements 130. Furthermore as shown in FIGS. 3 and 4, the sub-modules 150 are disposed on the plurality of heat exchanger and power delivery elements 130 such that both delivery of power and extracting heat from the sub-modules 150 are accomplished substantially simultaneously. In addition, FIGS. 3 and 4 show the power flow 320 and dielectric coolant flow paths 410 and 420 used to achieve both the delivery of power and extracting heat away from the sub-modules 150. Also, in these embodiments, the plurality of heat exchanger and power delivery elements 130 of alternatively differing supply voltages (positive and ground) are disposed such that they are electrically isolated from each other.

In addition as shown in FIGS. 1-4, the plurality of heat exchanger and power delivery elements 130 are disposed on the coolant manifold 120 such that the electrical connectors and connections 220 (shown in FIG. 2) associated with the sub-modules 150 and the rest of the integrated heat exchanger and power delivery system 100 passes through configured gaps 180 between the heat exchanger and power delivery elements 130. In some embodiments, the surfaces of the plurality of heat exchanger and power delivery elements 130 are anodized.

In these embodiments, as shown FIG. 4, each heat exchanger and power delivery element 130 of the integrated heat exchanger and power delivery system 400 is configured to receive a dielectric coolant to extract the heat away from the sub-modules 150. Exemplary dielectric coolant is a non-conductive coolant. Further in some embodiments, the coolant manifold 120 is made of substantially high strength and electrically isolating material. Exemplary coolant manifold material is a glass filled polymer or a dielectrically coated material.

As shown FIGS. 1-4, the plurality of heat exchanger and power delivery elements 130 are mechanically coupled to the coolant manifold substrate 110. Also, as shown in FIGS. 1-4, in some embodiments, the sub-modules 150 are thermally coupled to the plurality of heat exchanger and power delivery elements 130 using a thermally conductive epoxy.

In operation, as shown in FIG. 3, the DC power is supplied at the ends of the plurality of heat exchanger and power delivery elements 130 of the integrated heat exchanger and power delivery system 300, such that the power flows alternatively 310 and 320 to the plurality of heat exchanger and power delivery elements 130 and delivers the needed high power to the sub-modules 150 in the high powered electronic module 140. Further during operation, as shown in FIG. 4, the dielectric coolant is supplied at one end of the coolant manifold 410 and flows out at the other end of the coolant manifold 420. Further, the dielectric coolant flows in the plurality of heat exchanger and power delivery elements 130 before it flows out at the other end of the coolant manifold 420 to extract the heat away from the sub-modules 150, thereby it can be seen from FIGS. 3 and 4 that both the delivery of power to the sub-modules 150 and extracting of heat from the sub-modules 150 are achieved substantially simultaneously.

The foregoing descriptions of specific embodiments of the present disclosure have been presented for purposes of illustration and description. They are not intended to be exhaustive or to limit the present disclosure to the precise forms disclosed, and obviously many modifications and variations are possible in light of the above teaching. The embodiments were chosen and described in order to best explain the principles of the present disclosure and its practical application, to thereby enable others skilled in the art to best utilize the present disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. An integrated heat exchanger and power delivery system for high powered electronic modules, comprising:
   a coolant manifold;
   a heat exchanger and power delivery module, wherein the heat exchanger and power delivery module comprises a plurality of heat exchanger and power delivery elements that are coupled to the coolant manifold; and
   a high powered electronic module, wherein the high powered electronic module comprises an array of sub-modules, wherein the array of sub-modules is disposed on the plurality of heat exchanger and power delivery elements, and wherein the plurality of heat exchanger and power delivery elements are configured to simultaneously deliver power and extract heat away from the sub-modules.

2. The system of claim 1, wherein the plurality of heat exchanger and power delivery elements comprises bus bars that are scalable to power needs of the array of sub-modules.

3. The system of claim 1, wherein the plurality of heat exchanger and power delivery elements are configured alternatively to provide positive supply voltage and ground and further configured to carry direct current (DC).

4. The system of claim 1, wherein the plurality of heat exchanger and power delivery elements are disposed such that they are electrically isolated from each other.

5. The system of claim 1, wherein the plurality of heat exchanger and power delivery elements are disposed on the coolant manifold such that electrical connectors and connections associated with the sub-modules and rest of the integrated heat exchanger and power delivery system passes through configured gaps between the heat exchanger and power delivery elements.

6. The system of claim 1, wherein the surfaces of the plurality of heat exchanger and power delivery elements are anodized.

7. The system of claim 1, wherein each heat exchanger and power delivery element is configured to receive a dielectric coolant to extract heat away from the sub-modules.

8. The system of claim 7, wherein the dielectric coolant is non-conductive coolant.

9. The system of claim 1, wherein the coolant manifold is made of high strength and electrically isolating material.

10. The system of claim 9, wherein the coolant manifold is a glass filled polymer or a dielectrically coated material.

11. The system of claim 1, wherein the plurality of heat exchanger and power delivery elements are mechanically coupled to the coolant manifold.

12. The system of claim 1, wherein the sub-modules are thermally coupled to the plurality of heat exchanger and power delivery elements using a thermally conductive epoxy.

\* \* \* \* \*